United States Patent [19]

Nakayama

[11] Patent Number: 5,376,840

[45] Date of Patent: Dec. 27, 1994

[54] SUBSTRATE BIAS VOLTAGE GENERATOR HAVING CURRENT ABILITY BASED ON EXTERNAL AND INTERNAL POWER VOLTAGES

[75] Inventor: Hiroshi Nakayama, Tokyo, Japan

[73] Assignee: NEC Corporation, Tokyo, Japan

[21] Appl. No.: 982,606

[22] Filed: Nov. 27, 1992

[30] Foreign Application Priority Data

Nov. 29, 1991 [JP] Japan .................. 3-315943

[51] Int. Cl.5 .................. H03K 3/01; G11C 11/40
[52] U.S. Cl. .................. 327/537; 365/189.09; 365/226; 327/541; 327/546
[58] Field of Search .......... 307/296.1, 296.2, 296.6, 307/296.8, 296.5; 365/226, 227, 228, 229, 189.09

[56] References Cited

U.S. PATENT DOCUMENTS

| | | | |
|---|---|---|---|
| 4,961,007 | 10/1990 | Kumanoya et al. | 307/296.2 |
| 5,041,739 | 8/1991 | Goto | 307/296.6 |
| 5,146,110 | 9/1992 | Kim et al. | 307/296.2 |

FOREIGN PATENT DOCUMENTS 4039524 10/1991 Germany .
61-95561 5/1986 Japan .

*Primary Examiner*—Timothy P. Callahan
*Assistant Examiner*—Troug Phau
*Attorney, Agent, or Firm*—Sughrue, Mion, Zinn, Macpeak & Seas

[57] ABSTRACT

An LSI including a voltage drop circuit for receiving a voltage from an external power source and generating an internal power source voltage, a substrate biasing voltage generator circuit for generating a substrate biasing voltage, and a power on circuit for monitoring a voltage rising rate of the external power source and producing a control signal. The substrate biasing voltage generator circuit operates, in accordance with conditions of the control signal, to generate the substrate bias voltage having a first current capability based on the external power voltage or the substrate bias voltage having a second current capability based on the internal power source voltage. Thus, the LSI eliminates delay of start of operation of the LSI and reduces power consumption by the LSI due to a delay in the increase of the internal power source voltage which operates the substrate biasing voltage generator circuit.

17 Claims, 8 Drawing Sheets

SUBSTRATE BIAS VOLTAGE GENERATOR HAVING CURRENT ABILITY BASED ON EXTERNAL AND INTERNAL POWER VOLTAGES

BACKGROUND OF THE INVENTION

1. Field of the Invention

The present invention relates to a semiconductor integrated circuit and, particularly, to a large scale semiconductor integrated circuit (LSI) containing a substrate biasing voltage generator circuit for applying a reverse biasing voltage to a semiconductor substrate formed on its surface with an internal circuit and a voltage drop circuit for dropping an external power source voltage to obtain an internal source voltage to be supplied to the substrate biasing voltage generator circuit and the internal circuit as operating voltages thereof.

2. Description of the Prior Art

It is usual that, in order to increase an operating speed of an LSI and improve a stability thereof, the LSI contains a substrate biasing voltage generator circuit for applying a reverse biasing voltage (substrate biasing voltage) to a substrate formed on its surface with an internal circuit to reduce junction capacitance between the substrate and source/drain regions of MOS transistors constituting the internal circuit and to reduce the dependency of threshold voltages of the MOS transistors on the substrate biasing voltage. The substrate biasing voltage generator circuit has to be capable of minimizing undesired effects of existence thereof such as an increase of power consumption of the LSI and an operational delay of the LSI, specifically, an increase of time period from a time when an external power source voltage is applied thereto for which the LSI becomes in a ready state in which it is responsible to an external start control signal. A technique satisfying these requirements are disclosed in Japanese Kokai (P) No. Sho 61-95561.

An LSI disclosed in the Kokai contains two substrate biasing voltage generator circuit portions connected in parallel to each other between an output terminal of a substrate and a ground line of an internal circuit formed on the substrate and having different substrate current absorbing capabilities, that is, capabilities to allow substrate current caused by electric charge leaked from current in MOS transistors constituting the internal circuit to the substrate to be discharged to the ground line. The LSI further includes a control signal generator circuit for determining whether the substrate biasing voltage is increased to a predetermined voltage when an external power source voltage is applied thereto.

Since one of the substrate biasing voltage generator circuit portions, that is, one to be used in a standby model is enough to absorb a small substrate current corresponding to a standby current in the LSI in the standby mode, that is, a total current flowing from the external power source to the LSI in the standby state, its substrate current absorbing capability is small and thus its power consumption is small. On the other hand, since the other substrate biasing voltage generator circuit must absorb a large substrate current corresponding to an operating current of the LSI in an active mode, that is, a total current flowing from the external power source circuit to the LSI in the active mode, its substrate current absorbing capability is large and hence its power consumption is large.

During a time period in which an applied external power source voltage is in a normal level and the LSI is operating therewith, the substrate biasing voltage generator circuit portions operate to maintain the substrate biasing voltage at a predetermined voltage value, respectively. In detail, during a time period immediately after the external power source voltage is applied to the LSI and before the LSI is still in a state in which it can respond to any external input signal as yet, the active mode substrate biasing voltage generator circuit portion operates to rapidly increase the substrate biasing voltage to the predetermined voltage value by means of its large substrate current absorbing capability to thereby accelerate a start of operation of the LSI. That is, at the time when the external power source voltage is applied to the LSI, the control signal generator circuit first activates the active mode substrate biasing voltage generator circuit portion. Thereafter, when the control signal generator circuit detects the substrate biasing voltage reached the predetermined voltage value, it decides the LSI as to be operable and generates a control signal for starting the operation of the LSI. The control signal also makes the active mode substrate biasing voltage generator circuit portion switchable to the standby mode substrate biasing voltage generator circuit portion of small power consumption so that the substrate biasing voltage can be maintained constant.

The substrate biasing voltage generator circuit portions having different substrate current absorbing capabilities are used alternatively as mentioned above depending upon the operation mode of the LSI. That is, the active mode substrate biasing voltage generator circuit portion having large power consumption operates to absorb the substrate current only in the short time after the external power source voltage is applied to the LSI to thereby accelerate the rise of the substrate biasing voltage and in the active mode operation time of the LSI with the normal level external power source voltage to increase the operating speed of the LSI, while restricting a total power consumption of the whole LSI.

Besides, due to increased capacity of an LSI, there is a tendency that the LSI contains a voltage drop circuit for dropping an external power source voltage to an internal power source voltage and supplying the latter to the internal circuit thereof. When the technique disclosed in the aforementioned Kakai (P) Sho 61-95561 is to be applied to an LSI having such voltage drop circuit, the rising rate of the substrate biasing voltage after the external power source voltage is applied to the LSI is reduced, causing the start of operation of the LSI to be delayed. In order to avoid such delay, power consumption of a whole chip may be substantially increased. In an LSI in which a substrate biasing voltage generator is operated with the internal power source voltage from the voltage drop circuit, it is very difficult to reconcile acceleration of the start of operation of the LSI when the application of the external power source voltage and reduction of power consumption during a normal operation thereof.

In order to reduce power consumption of an LSI having a substrate biasing voltage generator circuit and a voltage drop circuit, a substrate biasing voltage generator circuit must be operated by an internal power source voltage. For example, it is assumed that a 16M bit DRAM operable with an internal power source voltage of 3.3 V obtained by dropping an external power source voltage of 5 V, and with a substrate biasing voltage being in the order of −2.0 V. When a standby mode substrate biasing voltage generator circuit portion is operated with the internal power source voltage of 3.3 V, a standby current including current to be consumed by the substrate biasing voltage generator circuit portion itself may be 300 μA at most. However, when it is operated with the external power source voltage of 5 V, the standby current is substantially increased up to the order of 7 to 8 mA a major part of which is consumed by the substrate biasing voltage generator circuit portion. On the other hand, when the substrate biasing voltage generator circuit portion is operated with the internal power source voltage from the voltage drop circuit, the power consumption of the whole chip can be restricted to a small value. However, the acceleration effect of the start of operation of the LSI at the time of application of the external power source voltage is lost.

The voltage drop circuit included in the LSI operates to drop the external power source voltage by a control signal generated within the chip after the external power source voltage is applied. Further, a parasitic capacitance of the internal power source line which may be provided mainly by junction capacitance in source/drain regions of MOS transistors constituting the internal circuit must be charged by an output voltage of the voltage drop circuit. Therefore, delay including time necessary to rise of the external power source voltage to a sufficient level in the chip, time necessary to generate the control signal to drop the external power source voltage to the internal power source voltage and time necessary to charge the parasitic capacitance is unavoidable. Thus, in the LSI including the substrate biasing voltage generator circuit driven by the internal power source voltage whose rising rate is lowered, a rising rate of the substrate biasing voltage is also lowered. Since the LSI disclosed in Kokai starts to operate according to the control signal generated by the control signal generator circuit upon detection of the substrate biasing voltage reached the predetermined value, the start of operation thereof is delayed.

One of methods for reducing power consumption of a whole LSI by operating the substrate biasing voltage generator circuit with the internal power source voltage while preventing the above mentioned delay of start of LSI operation is to use of a power-on circuit instead of such control signal generator circuit as used in the LSI disclosed in Kokai. A power-on circuit generally functions to monitor rising rate of the external power source voltage in a LSI, to inhibit input of an external start control signal (for example, RAS signal in DRAM) to the LSI to thereby prevent the internal circuit of the LSI from entering into an operating state until the external power source voltage reaches a predetermined voltage value and to generate a control signal for allowing the control signal to be input when the external power source voltage exceeds the predetermined voltage value to thereby make the LSI in operable state. By using the control signal from the power-on circuit instead of the control signal from the control signal generator circuit of the Kokai, the timing at which the LSI becomes operable after application of external power source voltage is controlled by the rising rate of not the substrate biasing voltage but the external power source voltage. Therefore, there is no case where the start of operation of the LSI is delayed by delay in operation of the voltage divider circuit, that is, lowered rising rate of the internal power source voltage.

In the LSI having the power-on circuit, the latter does monitor not the internal power source voltage or the substrate biasing voltage itself which is a reflection of rising rate of the internal power source voltage but the external power source voltage. Therefore, when there is a large difference in rising rate between the external power source voltage and the internal power source voltage, the substrate biasing voltage may not reach a predetermined voltage value due to lowered rising rate of the internal power source voltage even when the external power source voltage has reached the predetermined voltage value and so the LSI has started its operation.

In such case, the LSI may start to operate although a threshold voltage of a MOS transistor which may be in the order of the second power of the substrate biasing voltage does not reach the predetermined voltage value as yet. Therefore, both the standby current in the standby mode and the operating current in the active mode are increased beyond predetermined values. Since the standby mode substrate biasing voltage generator circuit portion and the active mode substrate biasing voltage generator circuit portion do not have capabilities of absorbing the substrate current increased to such level, the substrate biasing voltage after the LSI starts to operate is restricted to the voltage value at the start of operation of the LSI and therefore the threshold voltage of the MOS transistor never reaches the predetermined voltage value. As a result, the LSI operates with large current even after start of its operation regardless of operation mode and thus power consumption of the LSI is increased and malfunction may occur.

BRIEF SUMMARY OF THE INVENTION

Object of the Invention

Therefore, an object of the present invention is to provide a high speed LSI including a voltage drop circuit and a substrate biasing voltage generator circuit of low power consumption while preventing increase of power consumption and malfunction due to delay of rise of internal power source voltage after application of an external power source voltage, which tends to occur in LSI including such substrate biasing voltage generator circuit.

Summary of the Invention

An LSI according to the present invention is a single chip LSI including a substrate biasing voltage generator circuit for applying a reverse biasing voltage to a semiconductor substrate formed on its one surface with an internal circuit and a voltage drop circuit for dropping an external power source voltage supplied thereto to an internal power source voltage and supplying operating voltages obtained from the internal power source voltage to the substrate biasing voltage generator circuit and the internal circuit and is featured by that the substrate biasing voltage generator circuit includes an active mode substrate biasing voltage generator circuit portion capable of absorbing a large substrate current, whose current absorbing capability is switched in response to switching between the external power source voltage and the internal power source voltage, and a standby mode substrate biasing voltage generator circuit portion having small current absorbing capability and that a power-on circuit is included for controlling the substrate current absorbing capability of the active mode substrate biasing voltage generator circuit portion by switching the operating power source voltage of the active mode substrate biasing voltage generator circuit portion from the external power source voltage to the internal power source voltage in response to a result of monitoring of a voltage value of the external power source voltage during an initial rising stage thereof in the LSI immediately after application of it to the LSI.

The active mode substrate biasing voltage generator circuit portion includes an oscillator circuit whose output oscillation frequency is changed by a switching of an operating voltage thereof between the external power source voltage and the internal power source voltage caused by a control signal from the power-on circuit. The substrate current absorbing capability of the active mode substrate biasing voltage generator circuit portion is changed by the change of the oscillation frequency of the oscillation circuit thereof.

In the LSI according to the present invention, the active mode substrate biasing voltage generator circuit portion capable of absorbing a large substrate current is first activated when the external power source voltage is applied thereto. In this case, even if there is a delay in rising time of the internal power source voltage, the substrate biasing voltage increases with increase of the external power source voltage in the LSI reliably, the increasing rate of the substrate biasing voltage being higher than the increasing rate thereof when the active mode substrate biasing voltage generator circuit portion operates with only the internal power source voltage, so that the substrate biasing voltage has reached a predetermined voltage value reliably at a time when the LSI starts to operate. Therefore, any increase of power consumption of the whole chip and any malfunction of circuits caused by threshold voltage drop of MOS transistors constituting the internal circuit never occur.

BRIEF DESCRIPTION OF THE DRAWINGS

The above-mentioned and other objects, features and advantages of the present invention will become more apparent by reference to the following detailed description of the present invention taken in conjunction with the accompanying drawings wherein.

DETAILED DESCRIPTION OF THE INVENTION

Figure 1:
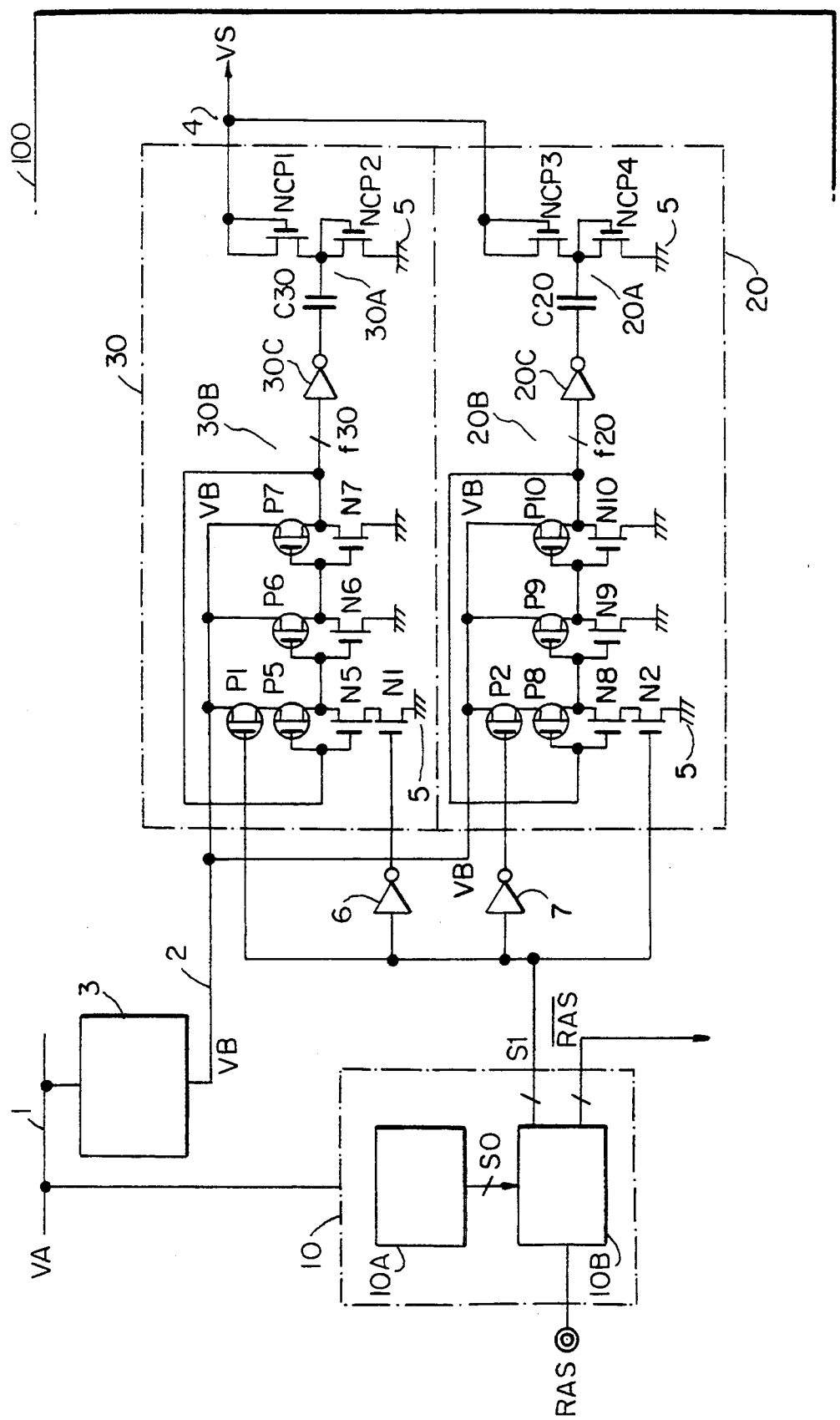
FIG. 1 is a circuit diagram of a portion of a conventional DRAM, including a substrate biasing voltage generator circuit, a power-on circuit and a voltage divider circuit.

In order to facilitate understanding of the present invention, a circuit portion of the conventional DRAM disclosed in the aforementioned Kokai related to the present invention will be described first with reference to FIGS. 1 to 4. In FIG. 1, the circuit portion of the conventional DRAM 100 related to the present invention includes a substrate biasing voltage generator circuit for generating a reverse biasing voltage Vs which is negative potential with respect to a ground potential of an internal circuit and is applied to a P type silicon substrate formed thereon with the internal circuit (not shown). The substrate biasing voltage is output at an output terminal 4 in FIG. 1. The circuit portion further includes a voltage drop circuit 3 for dropping an external power source voltage Va supplied from an external power source line 1 to obtain an internal power source voltage Vb which is supplied to the substrate biasing voltage generator through an internal power source line 2 and a power-on circuit 10 for switching capability of absorbing substrate current or current flowing from the output terminal 4 of the substrate biasing voltage generator circuit to a ground line 5 of the DRAM 100 according to rising rate of the external power source voltage Va after its application to the DRAM. It should be noted that Va, Vb and Vs indicate the external power source voltage, the internal power source voltage and the substrate biasing voltage, respectively, each including both transient state immediately after application of the external power source voltage to the DRAM and normal stable state.

The substrate biasing voltage generator circuit is composed of a standby mode substrate biasing voltage generator circuit portion 20 and an active mode substrate biasing voltage generator circuit portion 30 connected in parallel to the circuit 20. The parallel circuit of the active mode substrate biasing voltage generator circuit 20 and the standby mode substrate biasing voltage generator circuit portion 30 is connected between the output terminal 4 and the ground line 5. The substrate biasing voltage generator circuits 20 and 30 form charge pumping elements, respectively, each serving to pump up electric charge leaked from N channel MOS transistors constituting the internal circuit to the substrate from the output terminal 4 and to discharge it to the ground line 5 by means of the well known charge pumping action to thereby provide the substrate biasing voltage Vs at the output terminal 4.

That is, the active mode substrate biasing voltage generator circuit portion 30 includes a charge pump circuit 30A which is composed of a pair of diode-connected N channel MOS transistors Ncp1 and Ncp2 connected in series in forward direction between the output terminal 4 and the ground line 5 and a capacitor C30 having one electrode connected to a junction between the N channel MOS transistors and an oscillator circuit which is composed of a ring oscillator 30B including a 3-stage CMOS inverter and a feedback circuit 30F and an inverter 30C for amplifying, inverting and wave-shaping an oscillation output f30 of the ring oscillator 30B and supplying it to the other electrode of the capacitor C30.

The 3-stage CMOS inverter includes a first stage including a P channel MOS transistor P5 having a source electrode connected to the internal power source line 2 through a P channel MOS transistor P1 and an N channel MOS transistor N5 having a source electrode connected to the ground line 5 through an N channel MOS transistor N1, a second stage including a P channel MOS transistor P6 and an N channel MOS transistor N6 and a third stage including a P channel MOS transistor P7 and an N channel MOS transistor N7. The feedback circuit 30F is provided between an output which is a common drain electrode of the transistors P7 and N7 and an input which is a common gate electrode of the transistors P5 and N5 of the 3-stage inverter.

The capacitor C30 is charged with electric charge supplied from the output terminal 4 through the N channel MOS transistor Ncp1 and discharges it to the ground line 5 through the N channel MOS transistor Ncp2. The charging and discharging of the capacitor C30 alternates at a frequency corresponding to the oscillation frequency f30 of the ring oscillator 30B. Therefore, the substrate biasing voltage Vs at the output terminal 4 has a value proportional to the frequency of the oscillator output f30.

The active mode substrate biasing voltage generator circuit portion 30 is capable of absorbing a substrate current caused by an operating current in an active mode.

The standby mode substrate biasing voltage generator circuit portion 20 includes a charge pump circuit 20A which is composed of a pair of diode-connected N channel MOS transistors Ncp3 and Ncp4 connected in series in forward direction between the output terminal 4 and the ground line 5 and a capacitor C20 having one electrode connected to a junction between the N channel MOS transistors and an oscillator circuit which is composed of a ring oscillator 20B including a 3-stage CMOS inverter composed of a first set of a P channel MOS transistor P8 and an N channel MOS transistor N8, a second set of a P channel MOS transistor P9 and an N channel MOS transistor N9 and a third set of a P channel MOS transistor P10 and an N channel MOS transistor N10 and an inverter 20C. The capacitor C20 is charged with charge from the output terminal 4 and discharges it to the ground line 5 alternatively correspondingly to an oscillation frequency f20 of the ring oscillator 20B to generate the substrate biasing voltage Vs having a value proportional to the frequency of the oscillator output f20 at the output terminal 4.

A capability of absorbing the substrate current of the standby mode substrate biasing voltage generator circuit portion 20 is small enough to absorb substrate current caused by standby current in the standby mode.

In these substrate biasing voltage generator circuit portions 20 and 30, the gate electrodes of the transistors P1 and N2 are supplied with a signal S1 from the power-on circuit 10 to be described later and the gate electrodes of the transistors N1 and P2 are supplied with an inverted signal S1 from respective inverters 6 and 7 to be described later. The substrate current absorbing capabilities of the substrate biasing voltage generator circuit portions 20 and 30 are proportional to capacitances of the capacitors C20 and C30 of the charge pump circuits 20A and 30A and the frequencies of the oscillation outputs f20 and f30 of the ring oscillators 20B and 30B, respectively. The higher the operating voltages of the ring oscillators 20B and 30B in the active mode is the higher the frequencies of the oscillation outputs f20 and f30, respectively.

Figure 2:
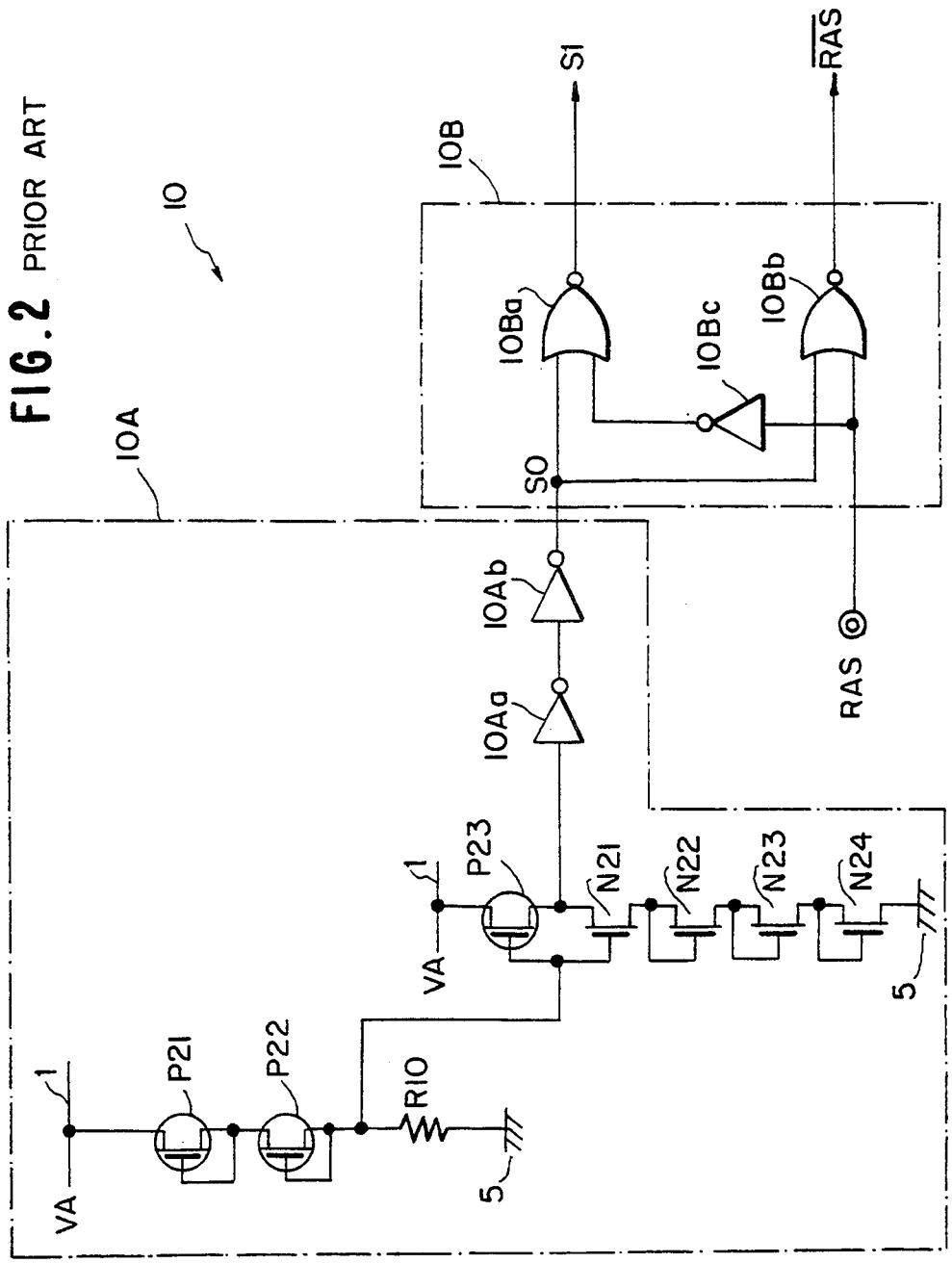
FIG. 2 is a detailed circuit diagram of an example of the power-on circuit shown in FIG. 1.

The power-on circuit 10 is composed of a detecting portion 10A for monitoring the external power source voltage Va applied thereto and a control portion 10B responsive to a signal S0 from the detecting portion 10A and an external RAS signal for generating a control signal S1 for controlling the substrate biasing voltage generator circuit portions 20 and 30 and an inverted RAS signal for the internal circuit. Referring to FIG. 2, the detecting portion 10A includes a series circuit connected between the external power source voltage line 1 and the ground line 5, which is composed of a series circuit of a resistor R10, a P channel MOS transistors P21 and a P channel MOS transistor P22, gate and drain electrodes of each of the P channel MOS transistors P21 and P22 being connected together to form a diode connection, a CMOS inverter connected between the external power source voltage line 1 and the ground line 5, which is composed of a P channel MOS transistor P23 and an N channel MOS transistor N21, a series circuit of N channel MOS transistors N22, N23 and N24, each having gate and drain electrodes connected together to form a diode connection, and a series connection of inverters 10Aa and 10Ab. The commonly connected gate electrodes of the transistors P23 and N21 are connected to a junction between the drain electrode of the transistor P22 and the resistor R10 and the commonly connected drain electrodes thereof are connected to an input terminal of the inverter 10Aa. The output signal S0 of the inverter 10Ab is supplied to the control portion 10B.

The control portion 10B is constituted with a 2-input NOR gate 10Ba responsive to the output signal S0 and an inverted RAS signal obtained by inverting an externally supplied RAS signal by an inverter 10Bc for outputting a control signal S1 and a 2-input NOR gate 10Bb responsive to the signal S0 and the RAS signal for outputting an inverted RAS signal. In the power-on circuit shown in FIG. 2, a portion thereof except the 2-input NOR gate 10Ba and the inverter 10Bc is necessary for an input control of the DRAM 100 at the time of application of the external power source voltage Va thereto and is usually provided on the chip regardless of whether or not the DRAM 100 contains the substrate biasing voltage generator circuit.

Figure 3:
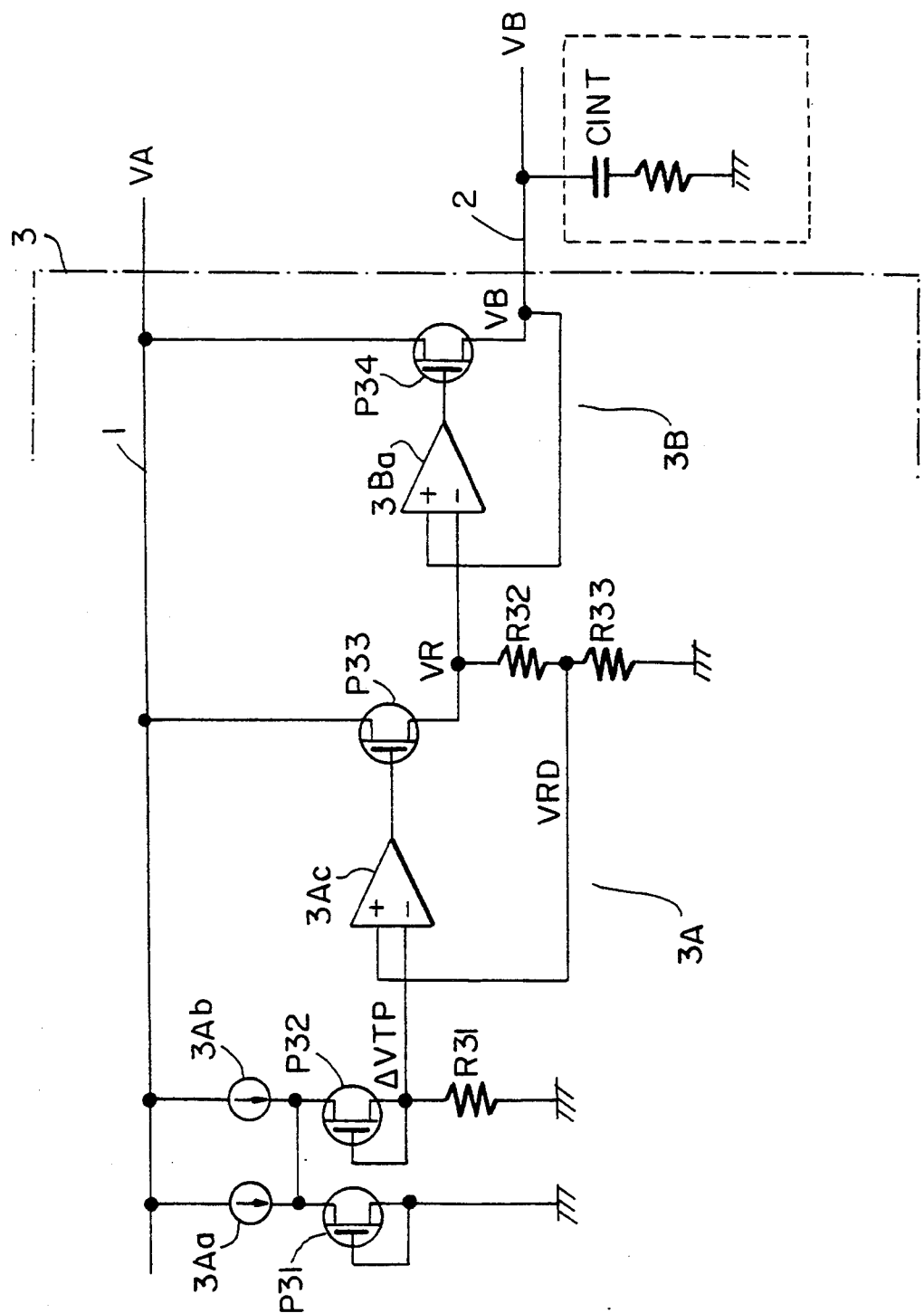
FIG. 3 is a detailed circuit diagram of an example of the voltage divider circuit shown in FIG. 1.

Referring to FIG. 3, the voltage drop circuit 3 includes a reference voltage generator portion 3A and a driver portion 3B. The reference voltage generator portion 3A includes, between the external power source voltage line 1 and the ground line 5, a circuit composed of a series connection of a constant current source 3Aa and a diode-connected P channel MOS transistor P31 and a series connection of a constant current source 3Ab, a diode-connected P channel MOS transistor P32 and a resistor R31, for generating an absolute value $\Delta Vtp$ of a voltage difference between a threshold voltage Vtp1 (e.g., $-1.4$ V) of the P channel MOS transistor P31 and a threshold voltage Vtp2 (e.g., $-0.7$ V) of the P channel MOS transistor P32, $\Delta Vtp = |Vtp1 - Vtp2| = 0.7$ V.

The reference voltage generator portion 3A further includes a circuit between the external power source line 1 and the ground line 5 which is composed of a series connection of a P channel MOS transistor P33 and resistors R32 and R33 for dividing the external power source voltage Va to obtain a voltage Vrd at a junction between the resistors R32 and R33 and a differential amplifier circuit 3Ac. The differential amplifier 3Ac changes a gate voltage of the P channel MOS transistor P33 according to a difference between the voltage Vrd and the voltage difference $\Delta Vtp$ to control a conductance of the transistor P33 such that an output voltage Vr thereof becomes constant.

The driver portion 3B includes a P channel MOS transistor P34 connected between the external power source line 1 and the internal power source line 2 and serving as a variable conductance element and a differential amplifier circuit 3Ba for changing a gate voltage of the transistor P34 according to a difference between the internal power source voltage Vb and the output voltage Vr of the reference voltage generator portion 3A to control a conductance of the transistor P34 such that the internal power source voltage Vb becomes constant.

In FIG. 3, assuming that the external power source voltage Va applied to the DRAM starts to rise from 0 V, the voltage drop circuit 3 does not operate until the external power source voltage Va reaches at least 1.4 V corresponding to an absolute value of the threshold voltage of the transistor P31 of the reference voltage generator portion 3A and so there is no internal power source voltage Vb generated. When the external power source voltage Va increases beyond 1.4 V, the internal power source voltage Vb starts to increase therewith. However, in an initial stage of increase of the internal power source voltage, a capacitor Cint shown in a portion surrounded by a dotted line must be charged. The capacitor Cint is a total capacitance related to the internal power source line 2 and it includes junction capacitance of source/drain regions of the MOS transistors constituting the internal circuit and stray capacitance. In order to stabilize the internal power source voltage, it may be possible to positively add a stabilizing capacitor of about 1000 pF thereto. For a 16M bit DRAM, the capacitor Cint may be in the order of about several thousands pF and, when, for example, the external power source voltage Va of 5 V is to be dropped to the internal power source voltage Vb of 3.3 V, there may be a case where time necessary to charge the capacitor Cint become several hundreds μs. Although, in a time period from the time of application of the external power source voltage Va to the time at which the internal power source voltage Vb reaches the predetermined voltage value, there is a time delay caused by time required for generating the reference voltage Vr and time necessary to charge the capacitor Cint, rising rate of the internal power source voltage Vb depends mainly upon the charging time of the capacitor Cint and the rising rate of the internal power source voltage Vb tends to be lower than the rising rate of the external power source voltage Va. This tendency is enhanced when the rising rate of the external power source voltage becomes higher. Since, in general, the rising rate (rising gradient) of the external power source voltage Va depends upon a characteristics of a power source circuit provided externally of the DRAM 100, the rising rate of the internal power source voltage Vb is influenced by both the characteristics of the voltage drop circuit and the characteristics of the external power source circuit. In any way, there should be no operational failure of the DRAM 100 regardless of the characteristics of the external power source circuit at a time when the external power source voltage is applied thereto.

Figure 4:
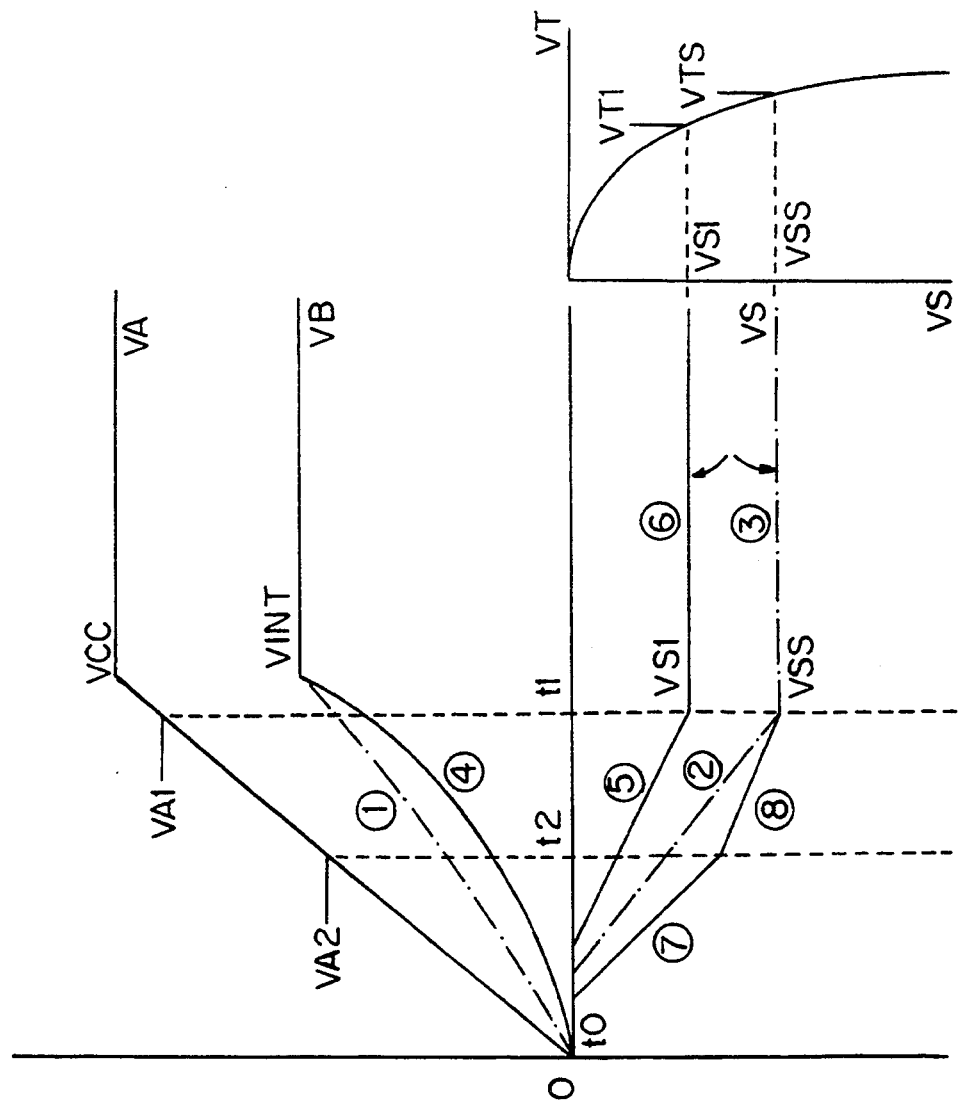
FIG. 4 is a timing chart for explanation of operation of circuit portions shown in FIGS. 1, 5 and 7.

FIG. 4 shows variations, with time, of the external power source voltage Va, the internal power source voltage Vb and the substrate biasing voltage Vs including their transient variations immediately after the application of the external power source voltage Va as well as a relation between a threshold voltage value Vt of a MOS transistor and the substrate biasing voltage Vs. As shown in FIG. 4, when the external power source voltage Va is applied to the DRAM at a time instance to, a voltage between the resistor R10 and the ground line 5 of the power-on circuit 10 (FIG. 2), that is, the input voltage of the CMOS inverter constituted with the transistors P23 and N21, is substantially 0 V since at least one of the transistors P21 and P22 is in non-conductive state in the period for which the voltage Va rises from 0 V to a value corresponding to an absolute value of a sum ($|2\,Vtp| = 1.4\,V$) of the threshold voltages Vtp (e.g., about $-0.7\,V$) of the transistors P21 and P22. Therefore, the signal S0 becomes H (high) level.

When the external power source voltage Va further increases beyond $|2\,Vtp|$, the transistors P21 and P22 are started to becomes conductive, so that they charge the gate capacitances of the transistors P23 and N21 causing the gate voltage, that is, the input signal voltage of the CMOS inverter to increase with increase of the external power source voltage Va. However, since at least one of the transistors N21, N22, N23 and N24 is in non-conductive state until the gate voltage of the transistors P23 and N21 reaches a sum ($4\,Vtn = 2.8\,V$) of the threshold voltages Vtn (e.g., 0.7 V) of the transistors N21 to N24, the output signal of the CMOS inverter constituted with the transistors P23 and N21, that is, the input signal to the inveter Aa, remains in L (low) level and thus the output signal S0 of the detecting portion is maintained in H level. Therefore, the control signal S1 and the inverted RAS signal from the 2-input NOR gates 10Ba and 10Bb supplied at their one inputs with this H level signal become L level regardless of the level of the RAS signal. As a result, the input of the RAS signal to the internal circuit is inhibited and thus the DRAM 100 is inhibited to operate.

At this time, the P channel MOS transistor P1 of the active mode substrate biasing voltage generator circuit portion 30 is turned on by the control signal S1 and the N channel MOS transistor N1 is also turned on by a H level signal obtained by inverting the signal S1 by the inverter 6. Therefore, the CMOS inverter in the first stage of the ring oscillator 30B is connected between the internal power source line 2 and the ground line 5 and self-oscillates. The charge pump circuit 30A is driven by the oscillation output f30 of the ring oscillator 30B to pump up electric charge from the output terminal 4, so that the substrate potential Vs is reduced quickly. On the other hand, in the standby mode substrate biasing voltage generator circuit portion 20, the P channel MOS transistor P2 is turned off by a H level signal which is the signal S1 inverted by the inverter 7. Since the N channel MOS transistor N2 having the gate electrode supplied with this signal S1 is also turned off thereby, the ring oscillator 20B is separated from the internal power source line 2 and the ground line 5 so that it does not oscillate. Therefore, the charge pump circuit 20A also stops its operation and thus the substrate biasing voltage generator circuit portion 20 does not contribute to reduction of the substrate biasing voltage.

When the gate voltage of the transistors P23 and N21 which increases with increase of the external power source voltage Va exceeds the above mentioned voltage value of 2.8 V, the transistors N21 to N24 are turned on. Therefore, the input signal of the inverter 10Aa changes its state from H level to L level and thus the signal S0 is changed from H level to L level. As a result, the control signal S1 and the inverted RAS signal from the 2-input NOR gates 10Ba and 10Bb are controlled by the RAS signal. That is, the RAS signal is allowed to pass into the internal circuit and thus the DRAM 100 enters into operation.

In the case shown in FIG. 2, when the RAS signal is H level, the inverted RAS signal becomes L level and so the DRAM 100 is set to the standby mode. Since, in the substrate biasing voltage generator circuit, the control signal S1 becomes H level, the ring oscillator 20B of the standby mode substrate biasing voltage generator circuit portion 20 is connected to the internal power source line 2 and self-oscillates. The charge pump circuit 20A thereof is driven by the output f20 of the ring oscillator 20B, so that the substrate current of an amount substantially proportional to the oscillation frequency is absorbed and a reverse biasing voltage Vs is applied to the output terminal 4. In this case, the active mode substrate biasing voltage generator circuit portion 30 is in a rest state.

When the RAS signal is L, the inverted RAS signal to the internal circuit becomes H level and thus the DRAM 100 is set to the active mode. In this case, since the control signal S1 becomes L level, the active mode substrate biasing voltage generator circuit portion 30 becomes operable. A voltage Va1 of the external power source voltage Va at the time when the DRAM 100 starts to operate is represented by the following equation:

$$Val = 2|Vtp| + 4Vtn \ (=4.2 \ V)$$

That is, the DRAM 100 is inhibited to receive the RAS signal by its internal circuit until the external power source voltage Va increases from 0 V at the application thereof to the DRAM to Val (=4.2 V). In this state, the active mode substrate biasing voltage generator circuit portion 30 having large capability of absorbing the substrate current is activated to reduce the substrate biasing voltage Vs. When the external power source voltage Va exceeds the value Val (at time instance t1 in FIG. 4), the input inhibition of the RAS signal to the internal circuit is removed and the levels of the control signal S1 and the inverted RAS signal are controlled by the RAS signal. In other words, the RAS signal selects the operation mode of the substrate biasing voltage generator circuit and the internal circuit, the active mode or standby mode, and the operation of the DRAM 100 is started.

It is assumed that the internal power source voltage Vb starts to increase substantially simultaneously with the external power source voltage Va with a slightly lower rate than that of the external power source voltage Va as shown by a curve 1 in FIG. 4. In such case, at a time instance t1 at which the DRAM 100 becomes in the state of operation, the substrate biasing voltage Vs has reached a voltage Vss as shown by a curve 2 in FIG. 4. The voltage Vss is a substrate biasing voltage in a range in which the threshold voltage Vt of the MOS transistor, which is substantially the second power of the substrate biasing voltage Vs, initially shows a tendency of saturation with respect to the substrate biasing voltage Vs. Therefore, the threshold voltage Vt of the MOS transistors constituting the internal circuit is set to the predetermined voltage value Vts and thus an influence of variation of the substrate biasing voltage Vs on the DRAM becomes sufficiently small.

On the other hand, when the rising rate of the external power source voltage Va is very high and so the increase of the internal power source voltage Vb occurs at a considerably low rate compared with the increase of the external power source voltage as shown by a curve 4 in FIG. 4, reduction of the substrate biasing voltage Vs is delayed as shown by a curve 5 in FIG. 4.

Therefore, the increase of the voltage Vs attained at the time instance t1 is limited to a voltage Vs1 which is smaller than the predetermined voltage Vss. Thus, the threshold values Vt of the respective MOS transistors of the internal circuit remain Vt1 lower than the predetermined threshold voltage Vts as shown by the graph in a lower right portion of FIG. 4. Therefore, at the start time of operation of the DRAM 100, drain currents of the respective MOS transistors of the internal circuit have been flowing and thus the DRAM 100 becomes in operation state while its operation start current flowing from the external power source circuit into the chip is larger than a predetermined value.

When the operation mode of the DRAM is switched from the active mode to the standby mode in response to the RAS signal, the active mode substrate biasing voltage generator circuit portion 30 is switched to the standby mode substrate biasing voltage generator circuit portion 20. Since the standby mode substrate biasing voltage generator circuit portion 20 thus activated can not absorb the substrate current due to the operation start current which exceeds the predetermined value, the substrate biasing voltage Vs1 at the time instance t1 is maintained as it is thereafter and can not reach the predetermined voltage Vss as shown by a curve 6 in FIG. 4. As a result, the threshold voltage Vt of the MOS transistor is maintained at a lower value Vt1 even after the DRAM 100 is switched to the standby mode and therefore the increased operation start current becomes the standby current in the standby mode.

On the other hand, when the DRAM is set in the active mode at the time instance t1, the active mode substrate biasing voltage generator circuit portion 30 continues to operate. In this case, however, since the internal circuit operates with an external input signal, e.g., an address signal, an operation current due to this operation flows. The operation current in this case becomes a value larger than a predetermined value correspondingly to the low threshold voltage value Vt of the MOS transistor of the internal circuit. Since the active mode substrate biasing voltage generator circuit portion 30 can not absorb the substrate current due to this increased operation current, the substrate biasing voltage after the time instance t1 is maintained at a value Vs1 lower than the predetermined voltage Vss as in the standby mode, and therefore the operation current in the active mode becomes larger than the above mentioned predetermined value.

As mentioned hereinbefore, the operation current of the DRAM 100 after its operation starts at the time instance t1 is maintained at a value higher than the predetermined value regardless of its operation mode and therefore power consumption is increased and memory content of the memory cell tends to be lost.

Figure 5:
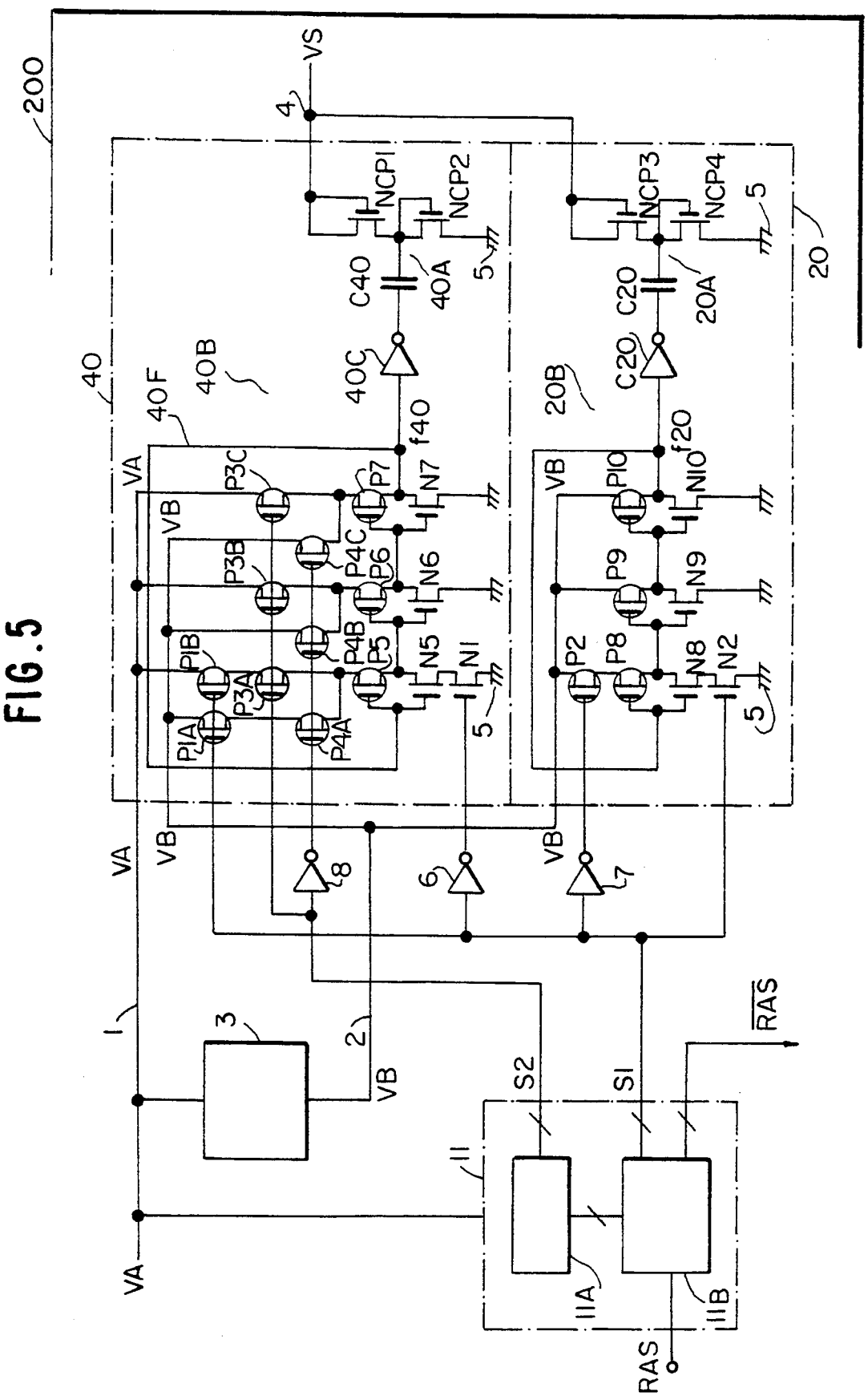
FIG. 5 is a circuit diagram of a first embodiment of the present invention, showing its circuit portion corresponding to that shown in FIG. 1.

FIG. 5 shows a 16M bits DRAM according to a first embodiment of the present invention, in which constitutional elements common to those shown in FIG. 1 are depicted by common reference numerals, respectively. The DRAM shown in FIG. 5 is the same as that shown in FIG. 1 except a constructions of the active mode substrate biasing voltage generator circuit portion and the power-on circuit.

In FIG. 5, an active mode substrate biasing voltage generator circuit portion 40 includes a ring oscillator 40B having a function of switching its operation power source voltage between an external power source voltage Va and an internal power source voltage Vb. A power-on circuit 11 outputs, in addition to the signal S1 for performing a switching between the active mode substrate biasing voltage generator circuit 40 and a standby mode substrate biasing voltage generator circuit 20, a control signal S2 for switching the operation power source voltage of the circuit 40. Constructions of a charge pump circuit 40A of the circuit 40, the standby mode substrate biasing voltage generator 20 and a voltage drop circuit 3 are identical to those used in the conventional DRAM 100 shown in FIG. 1, respectively. In the DRAM 200 shown in FIG. 5, the external power source voltage Va of 5 V is dropped to an internal power source voltage Vb of 3.3 V and a voltage of −2.2 V generated by the substrate biasing voltage generator circuit portion 20 or 40 is used as a substrate biasing voltage Vss. A threshold voltage Vts of a MOS transistor is set to a value of 0.7 V by the substrate biasing voltage Vss of −2.2 V.

An oscillator circuit of the substrate biasing voltage generator circuit portion 40 includes a ring oscillator 40B as a main component. The ring oscillator 40B includes a 3-stage CMOS inverter composed of a first stage including a P channel MOS transistor P5 and an N channel MOS transistor N5, a second stage including a P channel MOS transistor P6 and an N channel MOS transistor N6 and a third stage including a P channel MOS transistor P7 and an N channel MOS transistor N7 and a feedback circuit 40F connected between an output terminal of the CMOS inverter, that is, the common drain electrodes of the transistors P7 and N7 of the third stage, and an input terminal of the CMOS inverter, that is, common gate electrodes of the transistors P5 and N5 of the first stage. P channel MOS transistors are connected between an external power source line 1 and higher potential side electrodes of the respective MOS transistor stages of the CMOS inverter, that is, source electrodes of the transistors P5, P6 and P7, and between these source electrodes and an internal power source line 2, respectively.

That is, the source electrode of the MOS transistor P5 is connected to the internal power source line 2 through a drain electrode of a P channel MOS transistor P4a and a source electrode of a P channel MOS transistor P1a connected in series with the transistor P4a and connected to the external power source line 1 through a drain electrode of a P channel MOS transistor P3a and a source electrode of a P channel MOS transistor P1b connected in series with the transistor P3a. The source electrode of the transistor P6 is connected to the internal power source line 2 through drain-source electrodes of a P channel MOS transistor P4b and connected to the external power source line 1 through drain-source electrodes of a P channel MOS transistor P3b. The source electrode of the MOS transistor P7 is connected to the internal power source line 2 through drain-source electrodes of a P channel MOS transistor P4c and connected to the external power source line 1 through drain-source electrodes of a P channel MOS transistor P3c. The gate electrodes of the transistors P3a, P3b and P3c are supplied with the control signal S2 from the power-on circuit 11 to be described in detail later and the gate electrodes of the transistors P4a, P4b and P4c are supplied with the control signal S2 inverted by an inverter 8. The gate electrodes of the transistors P1a and P1b are supplied with the control signal S1 from the power-on circuit 11. Further, an N channel MOS transistor N1 is connected between a source electrode of the transistor N5 of the first stage of the CMOS inverter and the ground line 5 and the gate electrode of the transistor N1 is supplied with the control signal S1 inverted by an inverter 6.

A circuit construction of the charge pump circuit 40A constituting the active mode substrate biasing voltage generator circuit 40A is identical to that of the charge pump circuit 30A of the DRAM 100 shown in FIG. 1. Therefore, the active mode substrate biasing voltage generator circuit 40 of the DRAM 200 according to the first embodiment of the present invention has two substrate current absorbing capabilities which depend upon oscillation frequency f40 of the ring oscillator 40B, that is, whether the operating power source voltage is the external power source voltage Va or the internal power source voltage Vb.

In the DRAM 200 according to this embodiment in an active mode with the external power source voltage Va and the internal power source voltage Vb being stabilized, that is, Va=Vcc=5 V and Vb=Vint=3.3 V, the ring oscillator 40B of the active mode substrate biasing voltage generator circuit portion 40 self-oscillates at about 25 KHz with the internal power source voltage Vint being its operating voltage. The charge-pump circuit 40A responds to the oscillation output of the ring oscillator 40B to absorb a substrate current of about several hundreds A caused by operation current of about 80 mA flowing through the chip from the external power source circuit to thereby generate the substrate biasing voltage Vss of −2.2 V between the output terminal 4 and the ground line 5. On the other hand, when the DRAM 200 is in standby mode, the ring oscillator 20B of the standby mode substrate biasing voltage generator circuit portion 20 self-oscillates at about 200 KHz with the internal power source voltage Vint being its operation power source voltage and the charge pump 20A responds to this oscillation output to absorb a substrate current of about 10 A caused by a standby current of about 300 mA, flowing through the chip to thereby supply the substrate biasing voltage Vss of −2.2 V to the output terminal 4.

Figure 6:
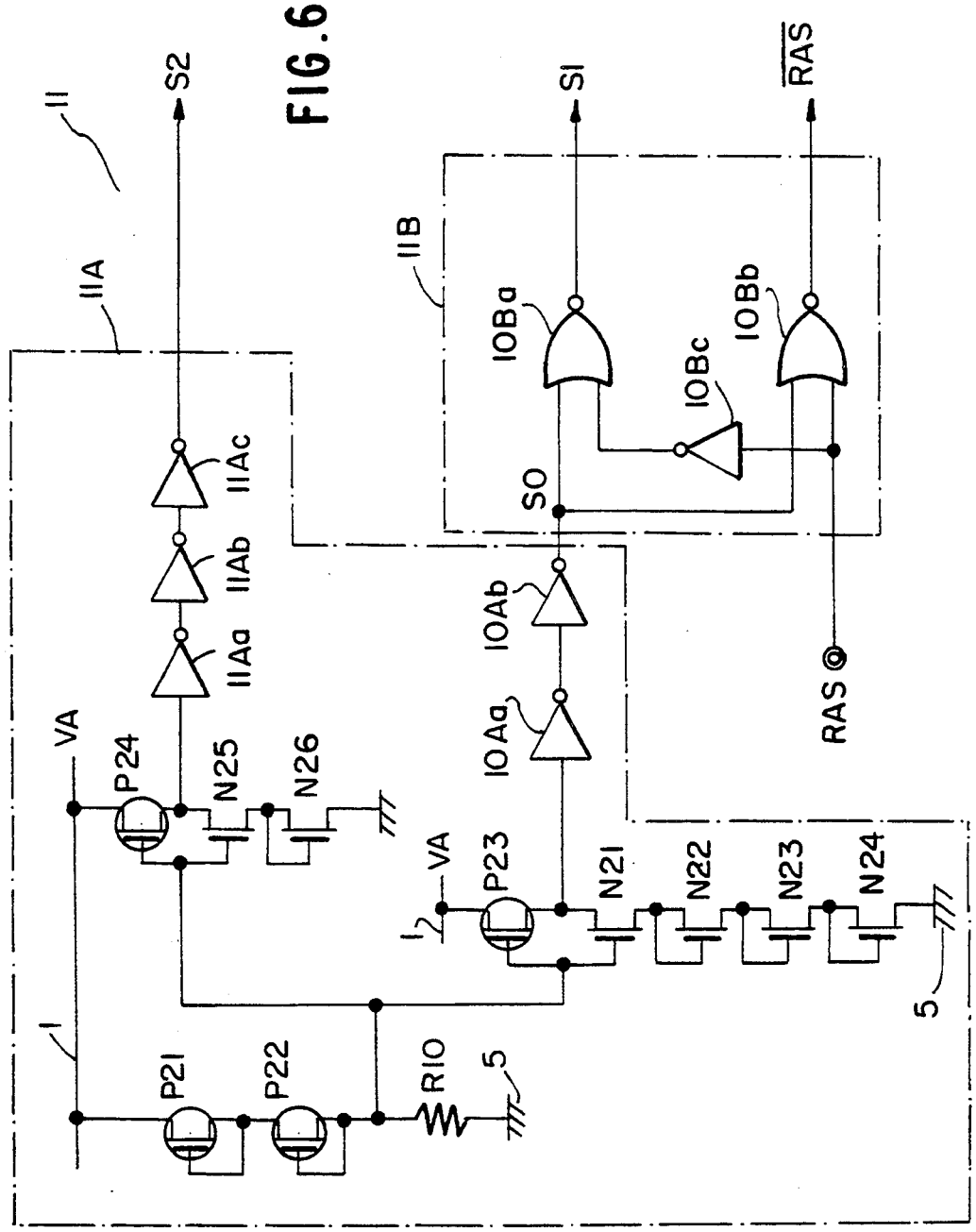
FIG. 6 is a detailed circuit diagram of an example of the power-on circuit shown in FIG. 5.

Referring to FIG. 6, the power-on circuit 11 of the DRAM 200 according to this embodiment includes, in addition to the constitutional components of the conventional power-on circuit 10 shown in FIG. 2, a circuit for generating the control signal S2 in its detection portion 11A. The control signal generator circuit for generating the control signal S2 includes, between the external power source line 1 and the ground line 5, a series circuit of a CMOS inverter composed of a P channel MOS transistor P24 and an N channel MOS transistor N25 and a diode-connected N channel MOS transistor N26 having a gate and a drain electrodes connected together and a series connection of inverters 11Aa, 11Ab and 11Ac which wave-shapes an output signal of the CMOS inverter and outputs the control signal S2 by logical matching thereof.

Referring to FIG. 4 again, transient states of the external power source voltage Va, the internal power source voltage Vb and the substrate biasing voltage Vs after application of the external power source voltage in the DRAM 200 are shown in comparison with the previously mentioned transient state of them in the conventional DRAM 100. In the transient state, when the external power source voltage Va is lower than $2|Vtp|$, where Vtp is the threshold voltage of each of the P channel MOS transistors P21 and P22 and −0.7 V, the P channel MOS transistors P21 and P22 are in off state.

Therefore, a voltage between the resistor R10 and the ground line 5, that is the input voltage of the CMOS inverter composed of the transistors P24 and N25 is 0 V and thus the output control signal S2 is in L level. When the external power source voltage Va exceeds the previously mentioned voltage of 1.4 V, the transistors P21 and P22 are turned on to start charging of their gate capacitances. The input voltage of the CMOS inverter composed by these transistors increases with increase of the external power source voltage Va. However, when the voltage Va is lower than 2 Vtn where Vtn is the threshold voltages of the N channel MOS transistors N25 and N26 and is 0.7 V, at least one of the transistors N25 and N26 is in off state. Therefore, the output signal of the CMOS inverter composed of the transistors N24 and N25 is maintained at H level and the control signal S2 is kept at L level. Further, since the input voltage of the CMOS inverter composed of the transistors P23 and N21 is lower than a sum, 4 Vtn (=2.8 V), of the threshold voltages of the N channel MOS transistors N21, N22, N23 and N24, at least one of these four N channel MOS transistors is in off state. Therefore, the output signal S0 of the detection portion 11A is in H level and the output control signal S1 of the 2-input NOR gates 10Ba and 10Bb and the inverted RAS signal are in L level regardless of the state of the RAS signal. That is, the operation of the DRAM 200 is inhibited.

In this case, since the N channel MOS transistor N2 the P channel MOS transistor P2 of the ring oscillator 20A are turned off by the L level signal S1 and the H level signal S1 inverted by the inverter 7, respectively, the standby mode substrate biasing voltage generator circuit portion 20 is separated from the internal power source line 2 and the ground line 5 and the oscillation is stopped. On the other hand, in the active mode substrate biasing voltage generator circuit portion 40, the P channel MOS transistors P1a and P1b are in on states due to the L level control signal S1 and the N channel MOS transistor N1 is turned on by the H level signal which is the signal S1 inverted by the inverter 6. Further, the P channel MOS transistor P3a is turned on by the L level control signal S2 and the P channel MOS transistor P4a is turned off by the H level signal which is the control signal S2 inverted by the inverter 8. Therefore, the first stage of the 3-stage CMOS inverter of the ring oscillator 40B is connected between the external power source line 1 and the ground line 5 and self-oscillates with the external power source voltage Va as the operating voltage. The L level control signal S2 further turns on the P channel MOS transistors P3b and P3c and the H level signal from the inverter 8 turns off the P channel MOS transistors P4b and P4c. Accordingly, the second and third stages of the 3-stage CMOS inverter of the ring oscillator 40B are also connected between the external power source line 1 and the ground line 5. Thus, the ring oscillator 40B operates on the external power source voltage.

The charge pump circuit 40A is driven by the oscillation output f40 of the ring oscillator 40B and rapidly lowers the substrate biasing voltage Vs by the large substrate current absorbing capability as shown by the curve 7 in FIG. 4. The lowering rate of the substrate biasing voltage Vs is higher than that shown by the curve 2 in FIG. 4 when the circuit 30 of the conventional DRAM 100 is driven by the internal power source voltage vb without operational delay of the voltage drop circuit 3 as shown by the curve 1 in FIG. 4, since the operating voltage and hence the substrate current absorbing capability is larger than those in the conventional DRAM. Further, since in this case, the operating voltage of the circuit 40 is the external power source voltage Va, the substrate biasing voltage Vs is rapidly lowered reliably following the increase of the external power source voltage Va without influence of the operational delay of the voltage drop circuit 3.

When the external power source voltage Va is further increased and the gate voltage of the transistors P24 and N25 reaches 2 Vtn at a time instance t2 in FIG. 4, the control signal S2 from the detection portion 11A of the power-on circuit 11 is switched from L level to H level. As a result, the transistors P3a, P3b and P3c are turned off. Further, since the transistors P4a, P4b and P4c are turned on by the L level signal which is the signal S2 inverted by the inverter 8, the operating voltage of the ring oscillator 40B increases at a lower rate as shown by the curve 4 in FIG. 4 and the external power source voltage Va is switched to the internal power source voltage Vb. Therefore, the frequency of the oscillation output f40 of the ring oscillator 40B is lowered and thus the substrate current absorbing capability of the charge pump circuit 40A is lowered. However, since the signal S0 is still in H level at this time, the operation of the DRAM 200 is still inhibited and thus the substrate biasing voltage Vs is lowered at lower rate compared with that in a time period from the time instance t0 to t2 as shown by the curve 8 in FIG. 4 and reaches the predetermined voltage Vss at the time instance t1. The voltage value Va2 of the external power source voltage Va at the time t2 is represented as Va2=2|Vtp|+2Vtn=2.8 V.

When the external power source voltage Va further increases and reaches the predetermined voltage Va1 (=2|Vtp|+4Vtn=4.2V) at the time t1, the output signal S0 of the detecting portion 11A of the power-on circuit 11 is switched from H level to L level. Therefore, the DRAM 200 becomes in the operating state. At this time, since the substrate biasing voltage Vs has reached the predetermined voltage Vss and the threshold voltages of the MOS transistors constituting the internal circuit have reached the predetermined voltage Vts, the drain currents of these MOS transistors, that is, the operation starting current of the DRAM 200 is sufficiently small. At this time, if the RAS signal is in H level, the inverted RAS signal becomes L level and the control signal S1 becomes H level. Thus the DRAM 200 is set in the standby mode.

In the circuit 40, the P channel MOS transistors P1a and P1b are turned off by the signal S1 and the N channel MOS transistor N1 is also turned off by the L signal which is the signal S1 inverted by the inverter 6. Therefore, the ring oscillator 40B is disconnected from both the external power source line 1 and the internal power source line 2 and thus stops to operate. On the other hand, in the circuit 20, the N channel MOS transistor N2 is turned on by the signal S1 and the transistor P2 is also turned on by the L level signal which is the signal S1 inverted by the inverter 7. Therefore, the ring oscillator 20A is connected between the internal power source line 2 and the ground line 5 and its operation is started. That is, after the time instance t1, the circuit 20 operates instead of the circuit 40. Since, although the substrate current absorbing capability of the circuit 20 is sufficiently small, the operation starting current has been made sufficiently small at that time, the circuit 20 can absorb the substrate current due to this current, so that it can maintain the substrate biasing voltage Vs at the predetermined voltage Vss after the time instance t1 as shown by the curve 3 in FIG. 4.

On the other hand, if the RAS signal is in L level at the time instance t1, the inverted RAS signal becomes H level and thus the DRAM 200 is set in the active mode. At this time, since the control signal S1 is in L level, the circuit 40 of the substrate biasing voltage generator circuit portion 40 enters into operation contrarily to the case of the standby mode. In the active mode, an external input signal, such as address signal, is supplied to the internal circuit and an operating current caused by the operation of the internal circuit flows through the chip. In this case, however, since the threshold voltage of the MOS transistors of the internal circuit has reached the predetermined voltage value Vts, there is no increase of operating current due to insufficient reduction of the threshold voltage. Since the circuit has an enough capability of absorbing the substrate current due to this predetermined operating current, it is possible to maintain the substrate biasing voltage Vs at the predetermined value Vss after the time instance t1.

As described, in the DRAM 200 according to this embodiment, the active mode substrate biasing voltage generator circuit portion 40 oscillates with the external power source voltage Va in the initial stage in the time period from t0 to t2 in FIG. 4 immediately after the application of the external power source voltage Va. Therefore, the reducing rate of the substrate biasing voltage Vs shown by the curve 7 in FIG. 4 is always higher than that in the case where it operates with the internal power source voltage Vb shown by the curve 2 in FIG. 4 and follows the increase of the external power source voltage Va reliably. Therefore, at the time instance at which the DRAM 200 starts to operate, the substrate biasing voltage Vs has reached the predetermined voltage Vss and its operating current has become a predetermined small value. Thus, there is no considerable increase of power consumption caused by insufficient reduction of the substrate biasing voltage in the subsequent operation.

In the conventional 16M bits DRAM, there may be a case where the increasing rate of external power source voltage is varied and rising rate of the internal power source voltage is delayed so that the substrate biasing voltage at a start (t1) of operation, which should be at −2.2 V, does not reach even −1.0 V. In such case, the threshold voltages of the N channel MOS transistors constituting the internal circuit which is to be 0.7 V is restricted to about 0.3 V. Therefore, the standby current in the standby mode is increased from 300 μA to about 1 mA. Although, in the conventional DRAM, there may be a case where power consumption becomes several times due to low rising rate of the internal power source voltage at the application of the external power source voltage, there is no such problem in the DRAM according to the present invention. Further, there is no loss of memory cell content due to increase of drain current of the MOS transistors of the internal circuit in the present invention.

The active mode substrate biasing voltage generator circuit portion 40 described hereinbefore includes the single ring oscillator and switches the substrate current absorbing capability at the application of the external power source by switching the operating voltage from the external power source voltage to the internal power source voltage. Such switching of the substrate current absorbing capability can be realized by an active mode substrate biasing voltage generator circuit having a first ring oscillator whose operating voltage is fixed to the external power source voltage and a second ring oscillator whose operating voltage is fixed to the internal power source voltage.

Figure 7:
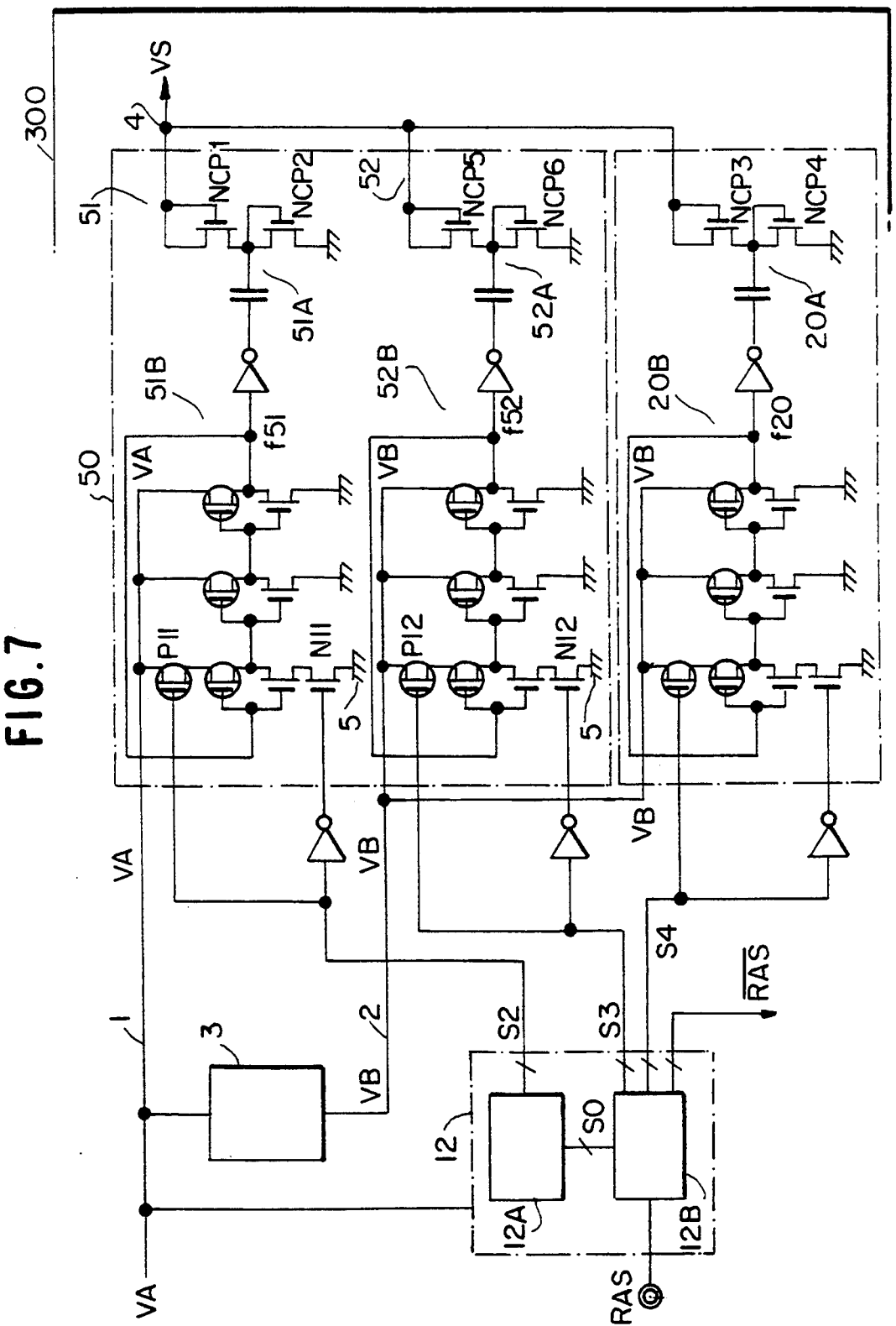
FIG. 7 is a circuit diagram of a second embodiment of the present invention, showing its circuit portion corresponding to that shown in FIG. 1.

Referring to FIG. 7 which shows a DRAM 300 according to a second embodiment of the present invention, an active mode substrate biasing voltage generator circuit portion 50 is constituted with a substrate biasing voltage generator circuit 51 whose operating voltage is fixed to the external power source voltage Va and a substrate biasing voltage generator circuit 52 whose operating voltage is fixed to the internal power source voltage Vb and a power-on circuit 12 is designed such that it outputs control signals S3 and S4 instead of the control signal S1 in the embodiment shown in FIG. 5. A voltage drop circuit 3 and a standby mode substrate biasing voltage generator circuit 20 of the DRAM 300 have the same constructions as those of the DRAM 200 shown in FIG. 5.

The substrate biasing voltage generator circuit 51 includes an oscillation circuit composed on a ring oscillator 51B including a 3-stage CMOS inverter and an inverter for inverting and amplifying an oscillation output f51 of the ring oscillator 51B and a charge pump circuit 51A composed of a capacitor and N channel MOS transistors Ncp1 and Ncp2 all of which are connected in the same way as of the circuit 40A in FIG. 5. A P channel MOS transistor P11 is connected between the external power source line 1 and a higher potential side of the first stage of the CMOS inverter of the ring oscillator 51B, that is, a source electrode of the P channel MOS transistor of the first stage, and an N channel MOS transistor N11 is connected between the ground line 5 and the ground side electrode, that is, a source electrode of the N channel MOS transistor thereof. A gate electrode of the transistor P11 is supplied with a control signal S2 from the power-on circuit 12 and a gate electrode of the transistor N11 is supplied with an inverted S2 signal. The substrate current absorbing capability of the substrate biasing voltage generator circuit 51 is identical to the substrate biasing voltage generator circuit 40 shown in FIG. 5 when the latter operates with the external power source voltage Va.

Similarly, the substrate biasing voltage generator circuit 52 includes a ring oscillator 52B composed of a 3-stage CMOS inverter and an inverter and a charge pump circuit 52A composed of a capacitor and N channel MOS transistors Ncp5 and Ncp6 all of which are connected in the same way as of the charge pump circuit 51A. The first stage CMOS inverter of the ring oscillator circuit 52B is connected to the internal power source line 2 through a P channel MOS transistor P12 and to the ground line 5 through an N channel MOS transistor N12. A gate electrode of the transistor P12 is supplied with the control signal S3 from the power-on circuit 12 and a gate electrode of the transistor N12 is supplied with an inverted control signal. S3. The substrate current absorbing capability of the substrate biasing voltage generator circuit 52 is identical to that of the circuit 40 in FIG. 5 when the latter operates with the internal power source voltage Vb.

Figure 8:
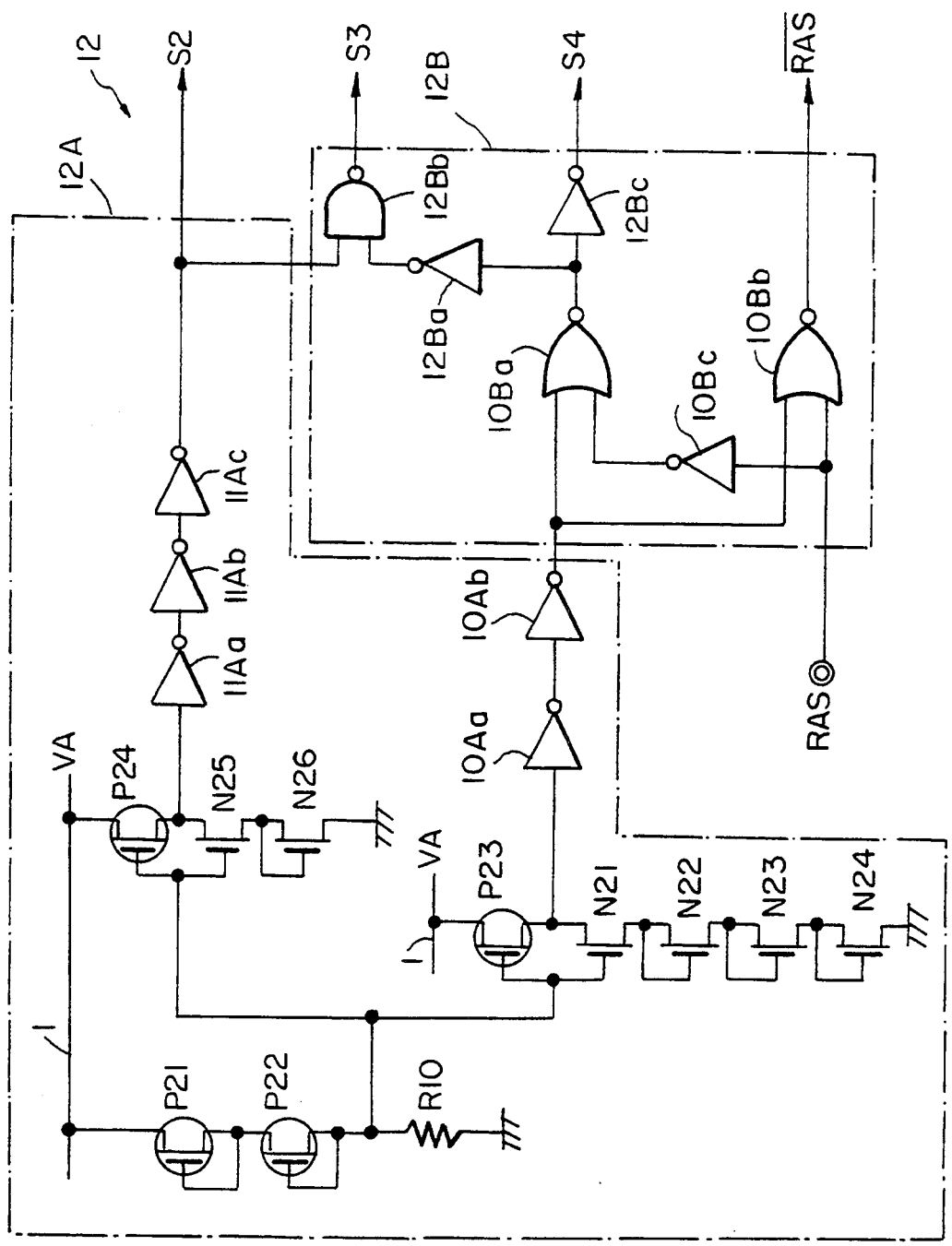
FIG. 8 is a detailed circuit diagram of an example of the power-on circuit shown in FIG. 7.

Referring to FIG. 8 which shows the power-on circuit 12 of the DRAM 300 according to this embodiment, a control portion 12B thereof includes, in addition to the same components as those of the power-on circuit 11 shown in FIG. 6, an inverter 12Ba and a 2-input NAND gate 12Bb for generating the control signal S3 and an inverter 12Bc for generating the control signal S4.

Referring to FIGS. 4, 7 and 8, since the control signal S2 is in L level in a range of the external power source voltage applied to the DRAM 300 at the time instance t0, from 0 V to Va2 ($=2|Vtp|+2$ Vtn=2.8 V), the output control signal S3 of the 2-input NAND gate 12Be whose one input is supplied with the latter L level signal S2 must be H level. Further, since the signal S0 is also in H level at this time, 2-input NOR gates 10Ba and 10Bb supplied with this H level signal S0 must provide L level signals, respectively. Therefore, an inverted RAS signal to the internal circuit and the control signal S4 which is the L level output signal from the 2-input NOR gate 10Ba inverted by the inverter 12Bc become L level signal and a H level signal, respectively, regardless of the state of the RAS signal. As a result, only the signal S2 is L level in this period from t0 to t2 in FIG. 4. The L level signal S2 turns on the P channel MOS transistor P11 further turns on the N channel MOS transistor N11 through the inverter. Accordingly, the ring oscillator 51B connected to the external power source line is allowed to operate. The remaining ring oscillators 52B and 20B do not operate. As a result, the substrate biasing voltage generator circuit 51 operates with the external power source voltage Va as the operating voltage to lower the substrate biasing voltage Vs as shown by the curve 7 in FIG. 4.

When the external power source voltage Va exceeds 2.8 V, the control signal S2 is inverted from L level to H level and the level of the control signal S3 is controlled by the output signal of the inverter 12Ba. Since the signal S0 is kept at H level until the external power source voltage Va reaches Va1 ($=2|Vtp|+4$ Vtn=4.2 V) at the time instance t1 in FIG. 4 and the output signal of the 2-input NAND gate 10Ba whose one input is supplied with this H level signal is L level, the output control signal S3 of the 2-input NAND gate 12Bb whose one input is supplied the L level output signal of the 2-input NOR gate 10Ba inverted by the inverter 12Ba becomes L level. On the other hand, the control signal S4 and the inverted RAS signal remain in H and L levels regardless of the state of the RAS signal, respectively. Since only the control signal S3 is in L level in this period from t2 to t1, to turn on the MOS transistors P12 and N12. The MOS transistors P11 and N11 are turned off, on the other hand. Therefore, the substrate biasing voltage generator circuit 51 stops its operation and instead the substrate biasing voltage generator circuit 52 operates with the internal power source voltage Vb.

The substrate current absorbing capability during this period is small correspondingly to low frequency of the oscillation output f52 of the ring oscillator 52B. However, since the DRAM 300 is inhibited to operate in this period, the substrate biasing voltage Vs is lowered to the predetermined value Vss as in the DRAM 200, as shown by the curve 8 in FIG. 4.

Since, when the external power source voltage Va exceeds 4.2 V, the control signal S0 is switched from H level to L level, the outputs of the 2-input NOR gates 10Ba and 10Bb whose one inputs are supplied with this L level signal are controlled by the level of the RAS signal and the DRAM 300 enters into the operation state. When the RAS signal is in H level, the DRAM 300 is set in the standby mode. The 2-input NOR gate 10Ba having one input supplied with the L level signal S0 and the other input supplied with the L level inverted RAS signal from the inverter 10Bc provides a H level output signal. Therefore, the control signal S3 from the 2-input NAND gate 12Bb having one input supplied with the L level signal from the inverter 12Ba connected to the H level output of the 2-input NOR gate 10Ba becomes H level. The control signal S4 which is the H level output signal of the 2-input NOR gate 10Ba inverted by the inverter 12Bc becomes L level. As a result, after the time instance t1, only the control signal S4 becomes L level when the DRAM 300 is in the standby mode, the operation of the standby mode substrate biasing voltage generator circuit 20 operates to keep the substrate biasing voltage Vs at the predetermined value Vss as in the case of the DRAM 200. On the other hand, when the RAS signal is in L level, the DRAM 300 is set in the active mode and the control signals S3 and S4 and the inverted RAS signal become L, H and H levels, respectively, contrarily to the standby mode. Therefore, the internal circuit operates on the basis of the external signals such as address signal.

In the active mode substrate biasing voltage generator circuit 50, the ring oscillator 52B of the substrate biasing voltage generator circuit 52 oscillates with the internal power source voltage Vb and the charge pump circuit 52A driven by the oscillation output f52 of the ring oscillator 52B maintains the substrate biasing voltage Vs at the predetermined voltage Vss as in the case of the DRAM 200.

In the DRAM 300 according to this embodiment, the control portion 12B of the power-on circuit 12 may becomes complicated a little and an area of the chip of the substrate biasing voltage generator circuit to be occupied by the control portion may increase. However, since the circuit 50 includes the ring oscillators 51B and 52B and the charge pump circuits 51A and 52A dedicated to the external power source voltage Va and the internal power source voltage Vb, respectively, it is possible to determine the substrate current absorbing capabilities separately, respectively. It can be generally said that, when a substrate biasing voltage of a DRAM having a substrate biasing voltage generator circuit is too low, there are demerits that a breakdown voltage of a gate oxide film existing between a gate electrode of a MOS transistor and a substrate becomes not enough, that an operation speed of an internal circuit in an active mode is reduced due to lack of drain current of the MOS transistor and/or that power consumption of the substrate biasing voltage generator circuit itself. In the DRAM 300 according to this embodiment, such demerits can be effectively avoided since the decreasing rate of the substrate biasing voltage at the time of application of the external power source voltage can be easily optimized.

Although the present invention has been described as applied to a DRAM, the present invention can be applied to any LSI having two operation modes, active mode and standby mode, such as an SRAM or other logical integrated circuits, with similar effects.

Although the present has been described with reference to specific embodiments, this description is not meant to be construed in a limiting sense. Various modifications of the disclosed embodiments, as well as other embodiments of the present invention, will becomes apparent to persons skilled in the art upon reference to the description of the present invention. It is, therefore, contemplated that the appended claims will cover any modifications or embodiments as fall within the true scope of the present invention.

What is claimed is:

1. A semiconductor integrated circuit comprising:
a power terminal for being supplied with an external power voltage;
means, coupled to said power terminal, for generating an internal power voltage lower than said external power voltage;
a substrate bias voltage generator for generating a substrate bias voltage;
means, coupled to said power terminal and responsive to a change in level of said external power voltage, for producing a control signal during a predetermined time period from a time at which said external power voltage is switched on;
means, responsive to a first condition of said control signal being produced, for causing said substrate bias voltage generator to operate based on said external power voltage to generate said substrate bias voltage with a first current capability; and
means, responsive to a second condition of said control signal, for causing said substrate bias voltage generator to operate based on said internal power voltage to generate said substrate bias voltage with a second current capability lower than said first current capability.

2. A semiconductor integrated circuit as claimed in claim 1, wherein said means responsive to said first condition comprises a plurality of transistors each coupled to said power terminal.

3. A semiconductor integrated circuit as claimed in claim 2, wherein said transistors are MOS transistors each having a source, drain and gate electrode, said source and gate electrodes of said plurality of transistors are each coupled to said power terminal and said control signal producing means, respectively.

4. A semiconductor integrated circuit as claimed in claim 1, wherein said means responsive to said second condition comprises a plurality of transistors each coupled to said internal power voltage generating means.

5. A semiconductor integrated circuit as claimed in claim 4, wherein said transistors are MOS transistors each having a source, drain and gate electrode, said source and gate electrodes of said plurality of transistors are each coupled to said internal voltage generating means and said control signal producing means, respectively.

6. A semiconductor integrated circuit comprising:
a power terminal for being supplied with an external power voltage;
means, coupled to said power terminal, for generating an internal power voltage lower than said external power voltage;
a substrate bias voltage generator including first and second voltage generators, said first voltage generator generating, when activated, a substrate bias voltage with a first current capability and said second voltage generator generating, when activated, a substrate bias voltage with a second current capability lower than said first current capability;
means for activating said first voltage generator by supplying said internal power voltage thereto in an active mode and said second voltage generator by supplying said internal power voltage thereto in a stand-by mode;
means, coupled to said power terminal, for producing a control signal indicative of a transition state of said external power voltage caused by a switch-on of said external power voltage; and
means, responsive to said control signal, for activating said first voltage generator by supplying said external power voltage thereto while deactivating said second voltage generator.

7. A semiconductor integrated circuit as claimed in claim 6, wherein said first voltage generator comprises a plurality of transistors each coupled to said power terminal.

8. A semiconductor integrated circuit as claimed in claim 7, wherein said transistors are MOS transistors each having a source, drain and gate electrode, said source and gate electrodes of said plurality of transistors are each coupled to said power terminal and said control signal producing means, respectively.

9. A semiconductor integrated circuit as claimed in claim 6, wherein said second voltage generator comprises a plurality of transistors each coupled to said internal power voltage generating means.

10. A semiconductor integrated circuit as claimed in claim 9, wherein said transistors are MOS transistors each having a source, drain and gate electrode, said source and gate electrodes of said plurality of transistors are each coupled to said internal voltage generating means and said control signal producing means, respectively.

11. A semiconductor integrated circuit comprising:
a power terminal for being supplied with an external power voltage;
means, coupled to said power terminal, for generating an internal power voltage lower than said external power voltage;
a first substrate bias voltage circuit operating, when activated, based on said internal power voltage to generate a first substrate bias voltage with a first current capability;
a second substrate bias voltage circuit operating, when activated, based on said internal power voltage to generate a second substrate bias voltage with a second current capability larger than said first current capability;
a third substrate bias voltage circuit operating, when activated, on said external power voltage to generate a third substrate bias voltage with a third current capability larger than said first current capability;
first means, responsive to a stand-by mode of said semiconductor integrated circuit, for activating said first substrate bias voltage circuit while deactivating said second and third substrate bias voltage circuits;
second means, responsive to an active mode of said semiconductor integrated circuit, for activating said second substrate bias voltage circuit while deactivating said first and third substrate bias voltage circuits;
means, coupled to said power terminal, for producing a control signal representative of a transition state of said external power voltage caused by a switch-on of said external power voltage; and
third means, responsive to said control signal, for activating said third substrate bias voltage circuit while deactivating said first and second substrate bias voltage circuits.

12. A semiconductor integrated circuit as claimed in claim 11, wherein said first substrate bias voltage circuit comprises a plurality of transistors each coupled to said internal power voltage generating means.

13. A semiconductor integrated circuit as claimed in claim 12, wherein said transistors are MOS transistors each having a source, drain and gate electrode, said source electrodes of said plurality of transistors are each coupled to said internal power voltage generating means and said gate electrode of one of said transistors is coupled to said first activating means.

14. A semiconductor integrated circuit as claimed in claim 11, wherein said second substrate bias voltage circuit comprises a plurality of transistors each coupled to said internal power voltage generating means.

15. A semiconductor integrated circuit as claimed in claim 14, wherein said transistors are MOS transistors each having a source, drain and gate electrode, said source electrodes of said plurality of transistors are each coupled to said internal power voltage generating means and said gate electrode of one of said transistors is coupled to said second activating means.

16. A semiconductor integrated circuit as claimed in claim 11, wherein said third substrate bias voltage circuit comprises a plurality of transistors each coupled to said power terminal.

17. A semiconductor integrated circuit as claimed in claim 16, wherein said transistors are MOS transistors each having a source, drain and gate electrode, said source electrodes of said plurality of transistors are each coupled to said power terminal and said gate electrode of one of said transistors is coupled to said third activating means.

* * * * *